US008125251B2

(12) United States Patent
 Park

(10) Patent No.: US 8,125,251 B2
(45) Date of Patent: *Feb. 28, 2012

(54) SEMICONDUCTOR MEMORY DEVICE HAVING A CLOCK ALIGNMENT TRAINING CIRCUIT AND METHOD FOR OPERATING THE SAME

(75) Inventor: Jung-Hoon Park, Gyeonggi-do (KR)

(73) Assignee: Hynix Semiconductor, Gyeonggi-do (KR)

( * ) Notice: Subject to any disclaimer, the term of this patent is extended or adjusted under 35 U.S.C. 154(b) by 138 days.

This patent is subject to a terminal disclaimer.

(21) Appl. No.: 12/630,443

(22) Filed: Dec. 3, 2009

(65) Prior Publication Data

US 2011/0050294 A1 Mar. 3, 2011

(30) Foreign Application Priority Data

Sep. 1, 2009 (KR) .................. 10-2009-0082099

(51) Int. Cl.
  *G11C 8/18* (2006.01)
  *H03L 7/00* (2006.01)
(52) U.S. Cl. .......... 327/144; 327/14; 327/146; 327/163; 365/189.07; 365/233.1; 365/233.11; 365/233.12
(58) Field of Classification Search .......... 327/142–147, 327/155, 156, 162, 163; 365/189.011, 189.07, 365/191, 233.1, 233.11–233.13

See application file for complete search history.

(56) References Cited

U.S. PATENT DOCUMENTS

| 7,834,664 B2 * | 11/2010 | Yoon et al. ................. 327/3 |
| 7,859,939 B2 * | 12/2010 | Joo et al. ................... 365/233.1 |
| 7,889,594 B2 * | 2/2011 | Yoon et al. ................. 365/233.1 |
| 7,889,595 B2 * | 2/2011 | Park ........................ 365/233.1 |

FOREIGN PATENT DOCUMENTS

| KR | 100929828 | 12/2009 |
| KR | 1020100006873 | 1/2010 |

OTHER PUBLICATIONS

Notice of Allowance issued by the Korean Intellectual Property Office on May 31, 2011.

* cited by examiner

*Primary Examiner* — Patrick O'Neill
(74) *Attorney, Agent, or Firm* — IP & T Group LLP

(57) ABSTRACT

A semiconductor device includes a clock input block to receive a system clock and a data clock, a clock frequency dividing block to generate a plurality of multi-phase data frequency division clocks each of which has the phase difference of a predetermined size by dividing a frequency of the data clock and to determine whether or not phases of the plurality of multi-phase data frequency division clocks are reversed in response to a frequency division control signal, and a first phase detecting block to detect a phase of the system clock based on a phase of a first selected clock that is predetermined among the plurality of multi-phase data frequency division clocks and to determine a logic level of the frequency division control signal in response to the detected result.

30 Claims, 11 Drawing Sheets

FIG. 5
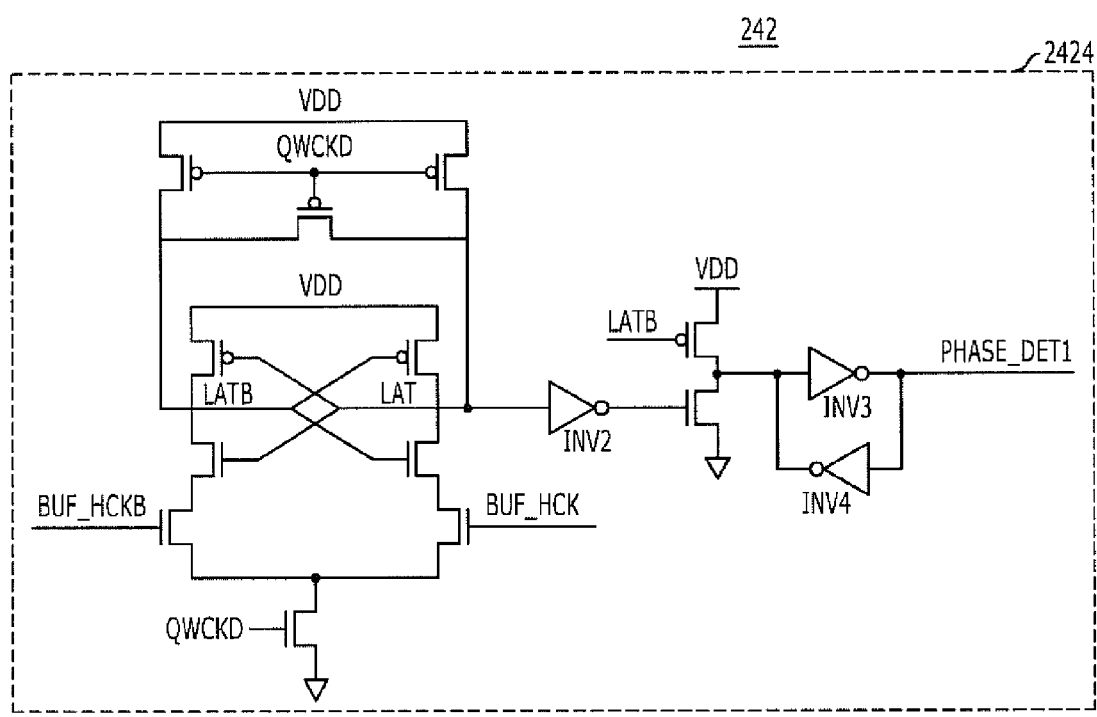
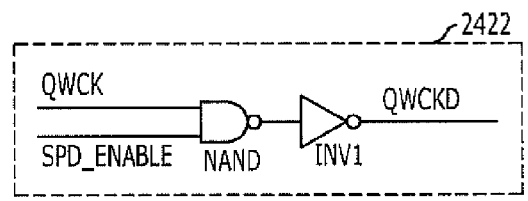

SEMICONDUCTOR MEMORY DEVICE HAVING A CLOCK ALIGNMENT TRAINING CIRCUIT AND METHOD FOR OPERATING THE SAME

CROSS-REFERENCE TO RELATED APPLICATION

The present application claims priority of Korean Patent Application No. 10-2009-0082099, filed on Sep. 1, 2009, which is incorporated herein by reference in its entirety.

BACKGROUND OF THE INVENTION

Exemplary embodiments of the present invention relate to semiconductor design technology, and more particularly, to a high-speed clock alignment training operation required in a semiconductor device.

In a system constructed with a plurality of semiconductor devices, the semiconductor devices are to store data. For instance, when a data processing apparatus such as a memory control unit (MCU) requires data, the semiconductor device outputs data corresponding to addresses inputted from a device requiring the data or stores data provided from the data requiring device at a position corresponding to the addresses.

For this purpose, a conventional semiconductor device operating at a high speed may be designed to input/output two data (e.g., two bits of data) between a rising edge and a falling edge of a system clock provided from the outside and to input/output two data between the falling edge and the next rising edge. That is, the semiconductor device is designed to input/output 4 data during one period of the system clock.

However, since the system clock is expressed by two states, i.e., a logic high level and a logic low level, there is required a data clock having a frequency two times greater than that of the system clock to input/output the 4 data during one period. That is, a dedicated clock for the data input/output is required.

Therefore, the semiconductor device operating in the high speed uses the system clock as a reference clock when transmitting and receiving addresses and commands and a data clock as the reference clock when inputting/outputting data, so that the data clock is controlled to have a frequency that is twice that of the system clock.

That is, two periods of the data clock correspond to one period of the system clock and the data input/output occurs at a rising edge and a falling edge of the data clock, so that 4 data (e.g., four bits) may be inputted/outputted during one period of the system clock.

Unlike a conventional double data rate (DDR) synchronous semiconductor device using one system clock as the reference clock to perform a read or write operation, the semiconductor device operating in the high speed transmits or receives data using two clocks having different frequencies from each other to perform the read or write operation.

However, if phases of the system clock and the data clock are not aligned with each other, timings for transmission of operational commands and addresses are not aligned with timings for transmission of the corresponding data. Thus, the semiconductor device operating in the high speed may not operate normally.

Therefore, for the normal operation of the semiconductor device operating in the high speed, the interface training between the semiconductor device and the data processing device should be performed during the initial operation of the semiconductor device.

Herein, the interface training is to train the semiconductor device for operation where the interface for transferring data, commands and addresses is optimized before the normal operation between the semiconductor device and the data processing device is performed.

The interface training is classified into the address training, the clock alignment training, i.e., WCK2CK training, the read training and the write training. Among them, an operation for aligning the data clock and the system clock is performed in the clock alignment training.

FIG. 1 illustrates a block diagram of a conventional circuit for performing a clock alignment training operation.

First of all, according to a basic principle of the clock alignment training, the semiconductor device operating in the high speed receives an address signal and a command signal from an external controller based on system clocks BUF_HCK and BUF_HCKB and outputs data stored therein to the external controller based on data clocks BUF_WCK and BUF_WCKB as described above.

Therefore, if there is the phase difference between the system clocks BUF_HCK and BUF_HCKB and the data clocks BUF_WCK and BUF_WCKB, the data stored in the semiconductor device may arrive at the external controller in advance or with a delay, where the advance or delay time corresponds to the phase difference.

Thus, at the beginning of the operation of the semiconductor device operating in the high speed, the clock alignment training is performed to detect the phase difference between the system clocks BUF_HCK and BUF_HCKB and the data clocks BUF_WCK and BUF_WCKB provided from the external controller and to reduce the phase difference between the system clocks BUF_HCK and BUF_HCKB and the data clocks BUF_WCK and BUF_WCKB by transmitting the detected result to the external controller.

That is, the conventional circuit for performing the clock alignment training described in FIG. 1 is a circuit for detecting the phase difference between the system clocks BUF_HCK and BUF_HCKB and the data clocks BUF_WCK and BUF_WCKB after receiving the system clocks BUF_HCK and BUF_HCKB and the data clocks BUF_WCK and BUF_WCKB from the external controller and transmitting the detected result to the external controller.

Referring to FIG. 1, the circuit includes a clock input block 100 to receive positive and negative clocks HCK and HCKB and generate the system clocks BUF_HCK and BUF_HCKB for synchronizing input points of the address signal and the command signal and receive positive and negative clocks WCK and WCKB and generate the data clocks BUF_WCK and BUF_WCKB for synchronizing input points of data signals from the external controller, wherein the data clocks BUF_WCK and BUF_WCKB have a frequency greater than that of the system clocks BUF_HCK and BUF_HCKB, a clock frequency dividing block 120 for generating a plurality of multi-phase data frequency division clocks IWCK, QWCK, IWCKB and QWCKB each of which has the phase difference of a predetermined size after dividing the frequency of the data clocks BUF_WCK and BUF_WCKB, a phase detecting block 160 for detecting phases of the system clocks BUF_HCK and BUF_HCKB based on a phase of a selected clock IWCK or IWCKB among the plurality of multi-phase data frequency division clocks IWCK, QWCK, IWCKB and QWCKB and generating a training information signal WCK2CK_INFO in response to the detected result, and a signal transmitting block 170 for transferring the training information signal WCK2CK_INFO to the outside.

The clock frequency dividing block 120 among the components of the conventional circuit for performing the clock alignment training performs an operation of generating the plurality of multi-phase data frequency division clocks IWCK, QWCK, IWCKB and QWCKB each having the phase difference of 90 degrees (that is, quadrature phase components) using a positive data clock WCK and a negative data clock WCKB inputted thereto in a state of having the phase difference of 180 degrees, wherein the positive and negative data clocks WCK and WCKB are inputted in a differential state.

At this time, it is difficult to predetermine the generating order of phases of the plurality of multi-phase data frequency division clocks IWCK, QWCK, IWCKB and QWCKB generated in the clock frequency dividing block 120 in comparison to the data clocks BUF_WCK and BUF_WCKB.

That is, if the positive data clock WCK has a logic high level and the negative data clock WCKB has a logic low level at a moment where the clock frequency dividing block 120 starts to operate, the plurality of multi-phase data frequency division clocks IWCK, QWCK, IWCKB and QWCKB are sequentially generated to have phases of 0 degree (IWCK), 90 degrees (QWCK), 180 degrees (IWCKB) and 270 degrees (QWCKB), respectively, in comparison to a phase of the positive data clock WCK.

On the other hand, if the positive data clock WCK has a logic low level and the negative data clock WCKB has a logic high level at the moment where the clock frequency dividing block 120 starts to operate, the plurality of multi-phase data frequency division clocks IWCK, QWCK, IWCKB and QWCKB are sequentially generated to have phases of 180 degrees (IWCK), 270 degrees (QWCK), 0 degree (IWCKB) and 90 degrees (QWCKB), respectively, in comparison to the phase of the positive data clock WCK.

Although there is a state where the operation of the clock frequency dividing block 120 cannot be predetermined through the design, an operation of comparing the phases of the system clocks BUF_HCK and BUF_HCKB and that of the selected clock IWCK or IWCKB among the plurality of multi-phase data frequency division clocks IWCK, QWCK, IWCKB and QWCKB generated in the clock frequency dividing block 120 is always performed in the preset order.

Therefore, in the case where the plurality of multi-phase data frequency division clocks IWCK, QWCK, IWCKB and QWCKB is sequentially generated to have the phases of 0 degree (IWCK), 90 degrees (QWCK), 180 degrees (IWCB) and 270 degrees (QWCKB) in comparison to the phase of the positive data clock WCK, by moving the phases of the data clocks BUF_WCK and BUF_WCKB by the maximum half period, i.e., 0.5*tck, it is possible to synchronize the phases of the system clocks BUF_HCK and BUF_HCKB with those of the data clocks BUF_WCK and BUF_WCKB, so that the clock alignment training operation can be completed within a comparatively short time.

In the meantime, in the case where the plurality of multi-phase data frequency division clocks IWCK, QWCK, IWCKB and QWCKB is sequentially generated to have the phases of 180 degrees (IWCK), 270 degrees (QWCK), 0 degree (IWCKB) and 90 degrees (QWCKB) in comparison to the phase of the positive data clock WCK, since the operation of synchronizing the phases of the system clocks BUF_HCK and BUF_HCKB with those of the data clocks BUF_WCK and BUF_WCKB should be performed by moving the phases of the data clocks BUF_WCK and BUF_WCKB by the maximum one period, i.e., 1*tck, it may take a relatively larger time until the clock alignment training operation is completed.

SUMMARY OF THE INVENTION

An embodiment of the present invention is directed to providing a circuit for performing a clock alignment training operation, capable of generating a plurality of multi-phase data frequency division clocks IWCK, QWCK, IWCKB and QWCKB to have phases in the predetermined order in contradiction to phases of data clocks BUF_WCK and BUF_WCKB.

In accordance with an embodiment of the present invention, a semiconductor device including a clock input block to receive a system clock and a data clock; a clock frequency dividing block to generate a plurality of multi-phase data frequency division clocks each of which has the phase difference of a predetermined size by dividing a frequency of the data clock and to determine whether or not phases of the plurality of multi-phase data frequency division clocks are to be reversed in response to a frequency division control signal; and a first phase detecting block to detect a phase of the system clock based on a phase of a first selected clock that is predetermined among the plurality of multi-phase data frequency division clocks and to determine a logic level of the frequency division control signal in response to the detected result. The semiconductor device further includes a second phase detecting block to detect the phase of the system clock based on a phase of a second selected clock that is selected among the plurality of multi-phase data frequency division clocks and to generate a training information signal in response to the detected result, and a signal transmitting block to transfer the training information signal to the outside.

In accordance with another embodiment of the present invention, a method for operating a semiconductor device, the method including receiving a system clock and a data clock; generating a plurality of multi-phase data frequency division clocks each of which has the phase difference of a predetermined size by dividing a frequency of the data clock and determining whether or not phases of the plurality of multi-phase data frequency division clocks are reversed in response to a frequency division control signal; sensing normal training mode entry or self-training mode entry; and detecting a phase of the system clock based on a phase of a first selected clock that is predetermined among the plurality of multi-phase data frequency division clocks in case of entering the self-training mode according to the sensed result and determining a logic level of the frequency division control signal in response to the detected result. The method further includes detecting the phase of the system clock based on a phase of a second selected clock that is selected among the plurality of multi-phase data frequency division clocks in case of entering the normal training mode according to the sensed result and determining a logic level of a training information signal in response to the detected result, and transmitting the training information signal to the outside.

BRIEF DESCRIPTION OF THE DRAWINGS

FIG. 5 illustrates a detailed circuit diagram of a phase comparing sector included in the first phase detecting block among the components of the circuit for performing the clock alignment training operation in accordance with the embodiment of the present invention described in FIG. 2.

DESCRIPTION OF SPECIFIC EMBODIMENTS

Figure 1:
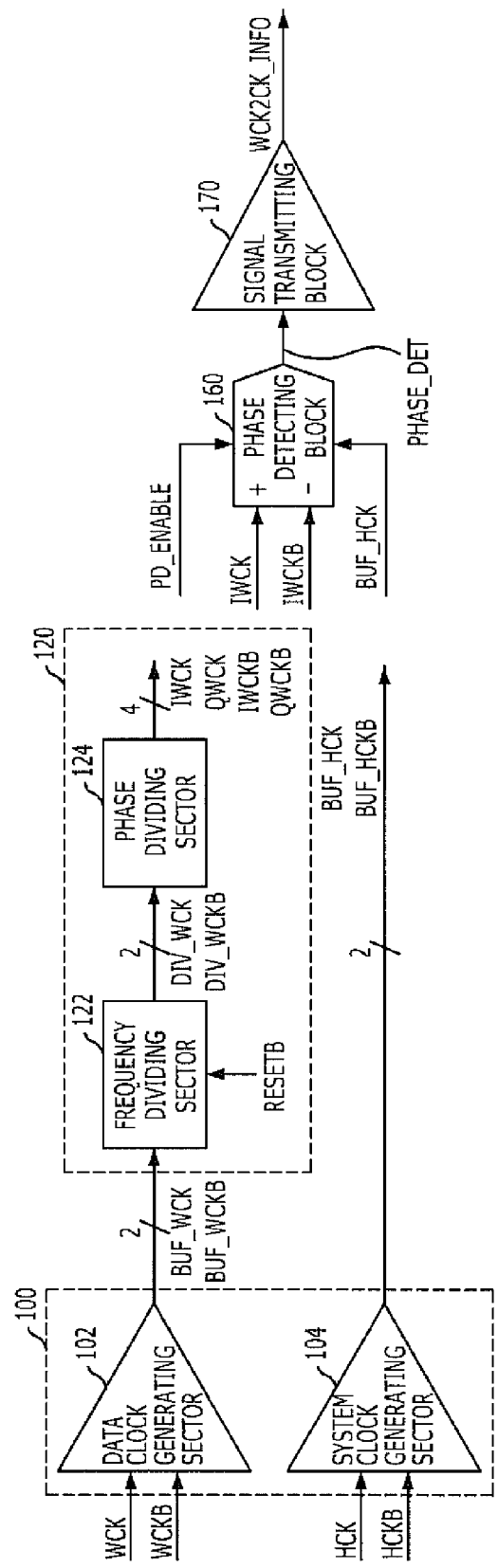
FIG. 1 illustrates a block diagram of a conventional circuit for performing a clock alignment training operation.

Exemplary embodiments of the present invention will be described below in more detail with reference to the accompanying drawings. The present invention may, however, be embodied in different forms and should not be constructed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 2:
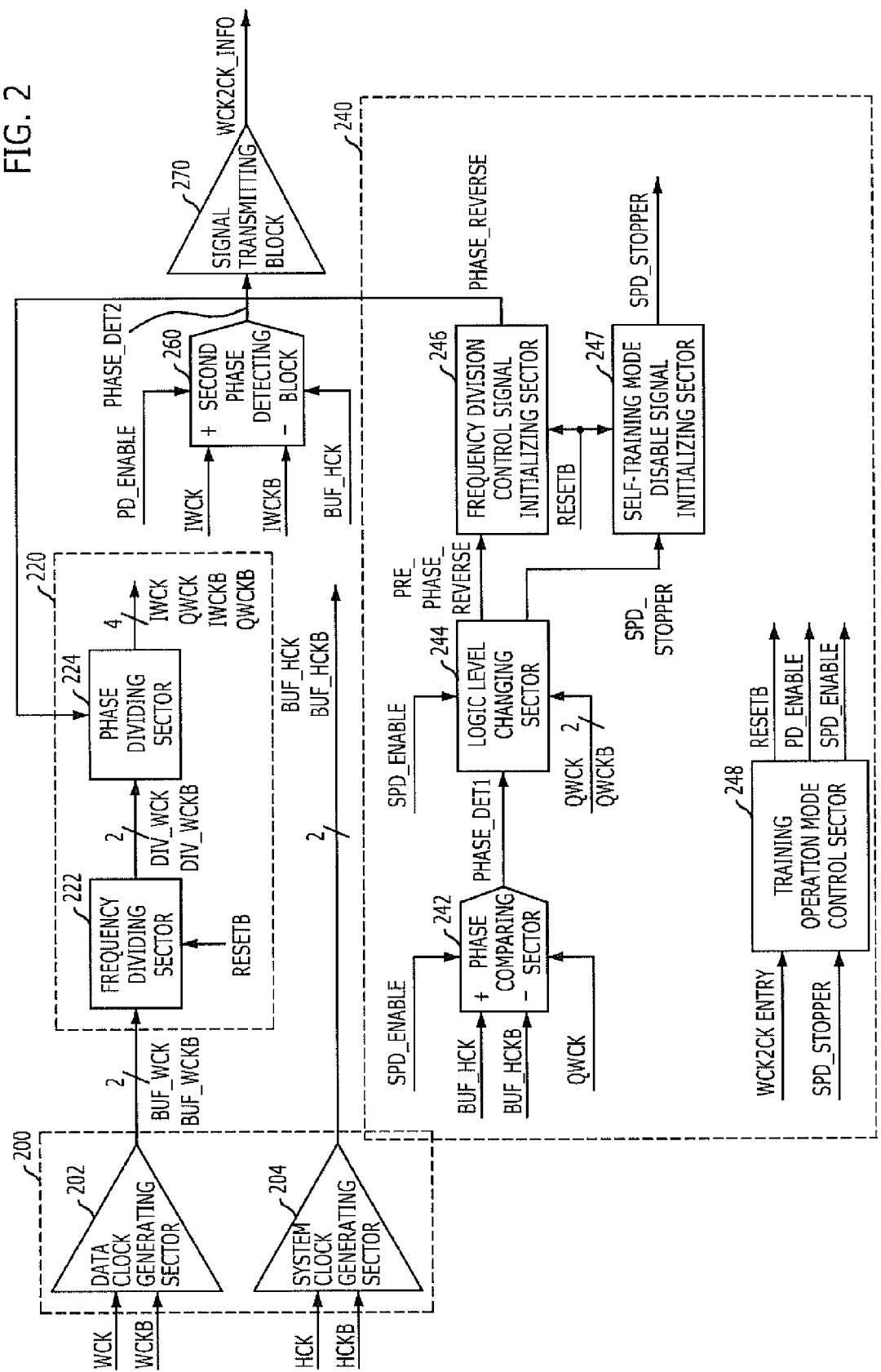
FIG. 2 illustrates a block diagram of a circuit for performing a clock alignment training operation in accordance with an embodiment of the present invention.

FIG. 2 illustrates a block diagram of a circuit for performing a clock alignment training operation in accordance with an embodiment of the present invention.

Referring to FIG. 2, the circuit for performing the clock alignment training operation includes a clock input block 200 for outputting system clocks BUF_HCK and BUF_HCKB and data clocks BUF_WCK and BUF_WCKB based on clocks HCK and HCKB and clocks WCK and WCKB, respectively, a clock frequency dividing block 220 for generating a plurality of multi-phase data frequency division clocks IWCK, QWCK, IWCKB and QWCKB each of which has the phase difference of a predetermined size by dividing a frequency of the data clocks BUF_WCK and BUF_WCKB and determining whether phases of the plurality of multi-phase data frequency division clocks IWCK, QWCK, IWCKB and QWCKB are reversed or not in response to a frequency division control signal PHASE_REVERSE, and a first phase detecting block 240 for detecting phases of the system clocks BUF_HCK and BUF_HCKB based on a phase of a first selected clock QWCK or QWCKB among the plurality of multi-phase data frequency division clocks IWCK, QWCK, IWCKB and QWCKB and determining a logic level of the frequency division control signal PHASE_REVERSE in response to the detected result. The circuit for performing the clock alignment training operation further includes a second phase detecting block 260 for detecting the phases of the system clocks BUF_HCK and BUF_HCKB based on a phase of a second selected clock IWCK or IWCKB among the plurality of multi-phase data frequency division clocks IWCK, QWCK, IWCKB and QWCKB and generating a training information signal WCK2CK_INFO in response to the detected result, and a signal transmitting block 270 for transferring the training information signal WCK2CK_INFO to the outside.

Herein, the clock input block 200 includes a system clock generating sector 204 for receiving the clocks HCK and HCKB for synchronizing input points of an address signal and a command signal and outputting the received clocks HCK and HCKB as the system clocks BUF_HCK and BUF_HCKB, and a data clock generating sector 202 for receiving the clocks WCK and WCKB for synchronizing input points of data signals from the outside and outputting the received clocks WCK and WCKB as the data clocks BUF_WCK and BUF_WCKB.

The clock frequency dividing block 220 includes a frequency dividing sector 222 for generating data frequency division clocks DIV_WCK and DIV_WCKB by dividing the frequency of the data clocks BUF_WCK and BUF_WCKB, and a phase dividing sector 224 for generating the plurality of multi-phase data frequency division clocks IWCK, QWCK, IWCKB and QWCKB in response to the data frequency division clocks DIV_WCK and DIV_WCKB and determining whether the phases of the plurality of multi-phase data frequency division clocks IWCK, QWCK, IWCKB and QWCKB are to be reversed or not in response to the frequency division control signal PHASE_REVERSE.

Herein, the phase dividing sector 224 of the clock frequency dividing block 220 generates the plurality of multi-phase data frequency division clocks IWCK, QWCK, IWCKB and QWCKB whose phases are reversed when the frequency division control signal PHASE_REVERSE is enabled to a logic high level, and produces the plurality of multi-phase data frequency division clocks IWCK, QWCK, IWCKB and QWCKB without reversing the phases of the plurality of multi-phase data frequency division clocks IWCK, QWCK, IWCKB and QWCKB when the frequency division control signal PHASE_REVERSE is disabled to a logic low level.

The first phase detecting block 240 includes a phase comparing sector 242 for comparing the phase of the first selected clock QWCK or QWCKB and the phases of the system clocks BUF_HCK and BUF_HCKB, and a logic level changing sector 244 for repeatedly receiving an output signal PHASE_DET1 of the phase comparing sector 242 predetermined times and changing logic levels of a self-training mode disable signal SPD_STOPPER and the frequency division control signal PHASE_REVERSE in response to the comparison result.

The first phase detecting block 240 further includes a training operation mode control sector 248 for determining logic levels of a is reset signal RESTB, a normal training mode enable signal PD_ENABLE and a self-training mode enable signal SPD_ENABLE in response to the self-training mode disable signal SPD_STOPPER and a clock alignment training entry control signal WCK2CK ENTRY enabled according to the starting of the clock alignment training operation.

For reference, a length of a period where the clock alignment training entry control signal WCK2CK ENTRY maintains its enable state of a logic high level and a moment where the clock alignment training entry control signal WCK2CK ENTRY is enabled to the logic high level from a logic low level are defined/stored in a mode register set (MRS).

Moreover, the first phase detecting block 240 further includes a frequency division control signal initializing sector 246 for initializing the frequency division control signal PHASE_REVERSE in response to the preliminary frequency division control signal PHASE_REVERSE outputted from the logic level changing sector 244 and in response to the reset signal RESETB and a self-training mode disable signal initializing sector 247 for initializing the self-training mode disable signal SPD_STOPPER outputted from the logic level changing sector 244 in response to the reset signal RESETB.

The phase comparing sector 242 of the first phase detecting block 240 determines whether the signal PHASE_DET1 outputted by determining whether or not the system clocks BUF_HCK and BUF_HCKB are enabled to a logic high level or disabled to a logic low level at an edge of the first selected clock QWCK or QWCKB is enabled or not, wherein the edge of the first selected clock QWCK or QWCKB generally means a rising edge but it may also be a falling edge according to the selection of a designer.

The logic level changing sector 244 of the first phase detecting block 240 changes the logic levels of the self-training mode disable signal SPD_STOPPER and the preliminary frequency division control signal PHASE_REVERSE and thus the frequency division control signal PHASE_REVERSE in response to the output signal PHASE_DET1 of the phase comparing sector 242 that is repeatedly inputted thereto the predetermined times in a period where the self-training mode enable signal SPD_ENABLE enabled to a logic high level in response to the starting of the clock alignment training operation maintains its enable state.

The frequency division control signal initializing sector 246 of the first phase detecting block 240 disables the frequency division control signal PHASE_REVERSE to a logic low level in response to the toggling of the reset signal RESETB at a moment where a self-training operation starts and thus makes the self-training operation to start in a state where the frequency division control signal PHASE_REVERSE definitely maintains the disable state of the logic low level.

The self-training mode disable signal initializing sector 247 of the first phase detecting block 240 disables the self-training mode disable signal SPD_STOPPER to a logic low level in response to the toggling of the reset signal RESETB at the moment where the self-training operation starts and thus makes the self-training operation to start in a state where the self-training mode disable signal SPD_STOPPER definitely maintains the disable state of the logic low level.

The first phase detecting block 240 operates only in the self-training operation mode where the self-training mode enable signal SPD_ENABLE maintains an enable state of a logic high level and does not operate in a normal training mode where the normal training mode enable signal PD_ENABLE maintains an enable state of a logic high level.

Likewise, the second phase detecting block 260 and the signal transmitting block 270 operate only in the normal training mode where the normal training mode enable signal PD_ENABLE maintains the enable state of the logic high level and do not operate in the self-training operation mode where the self-training mode enable signal SPD_ENABLE maintains the enable state of the logic high level.

As such, the normal training mode enable signal PD_ENABLE and the self-training mode enable signal SPD_ENABLE have opposite phases to each other.

The first selected clock QWCK or QWCKB has a phase that is not equal to and opposite to the phases of the data frequency division clocks DIV_WCK and DIV_WCKB.

Figure 10:
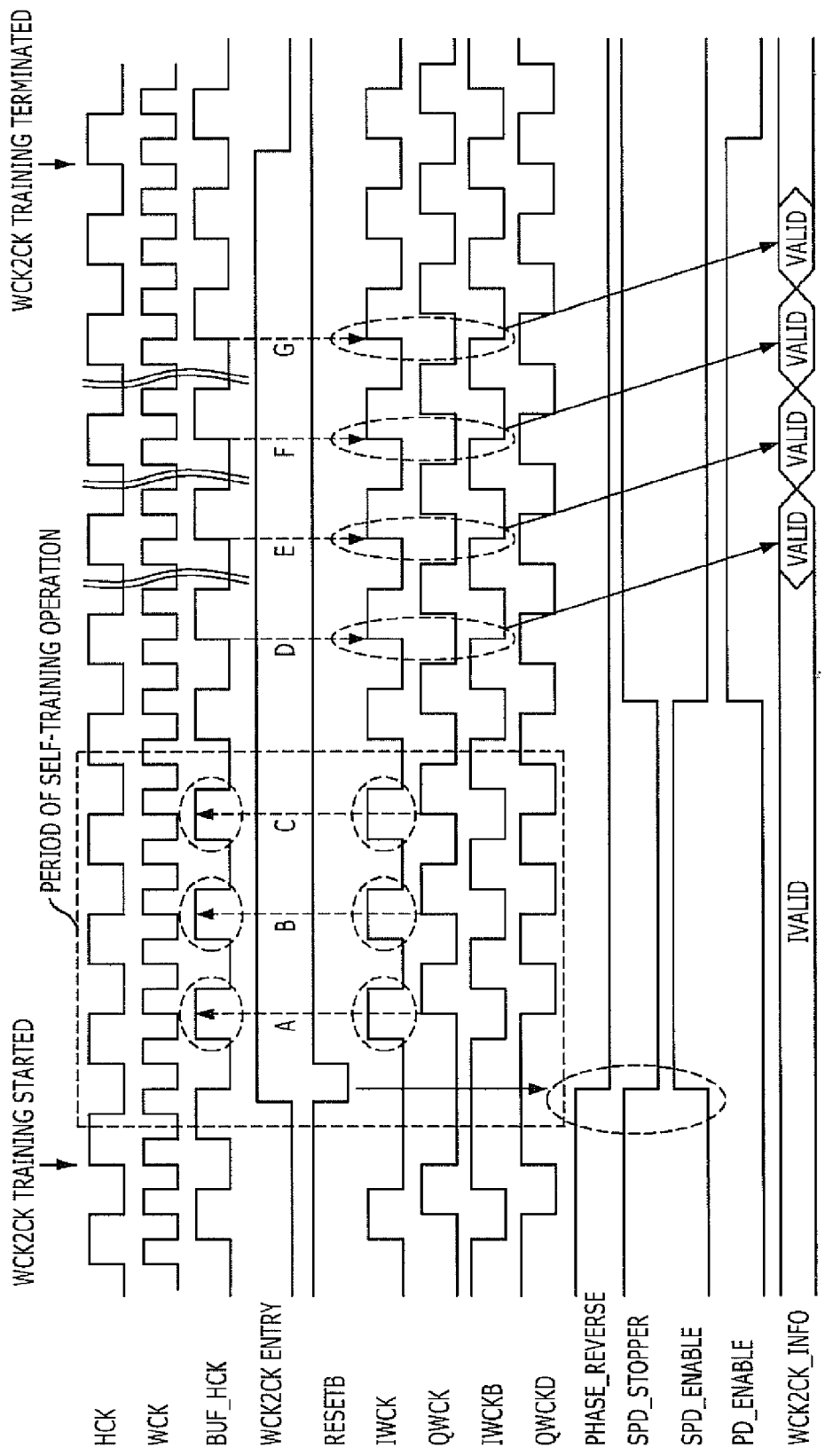
FIGS. 10 and 11 illustrate timing diagrams for explaining an operation of the circuit for performing the clock alignment training operation in accordance with the embodiment of the present invention described in FIG. 2, where there is no need to reverse the phases of the multi-phase data frequency division clocks IWCK, QWCK, IWCKB and QWCKB outputted from the phase dividing sector 224.
Figure 12:
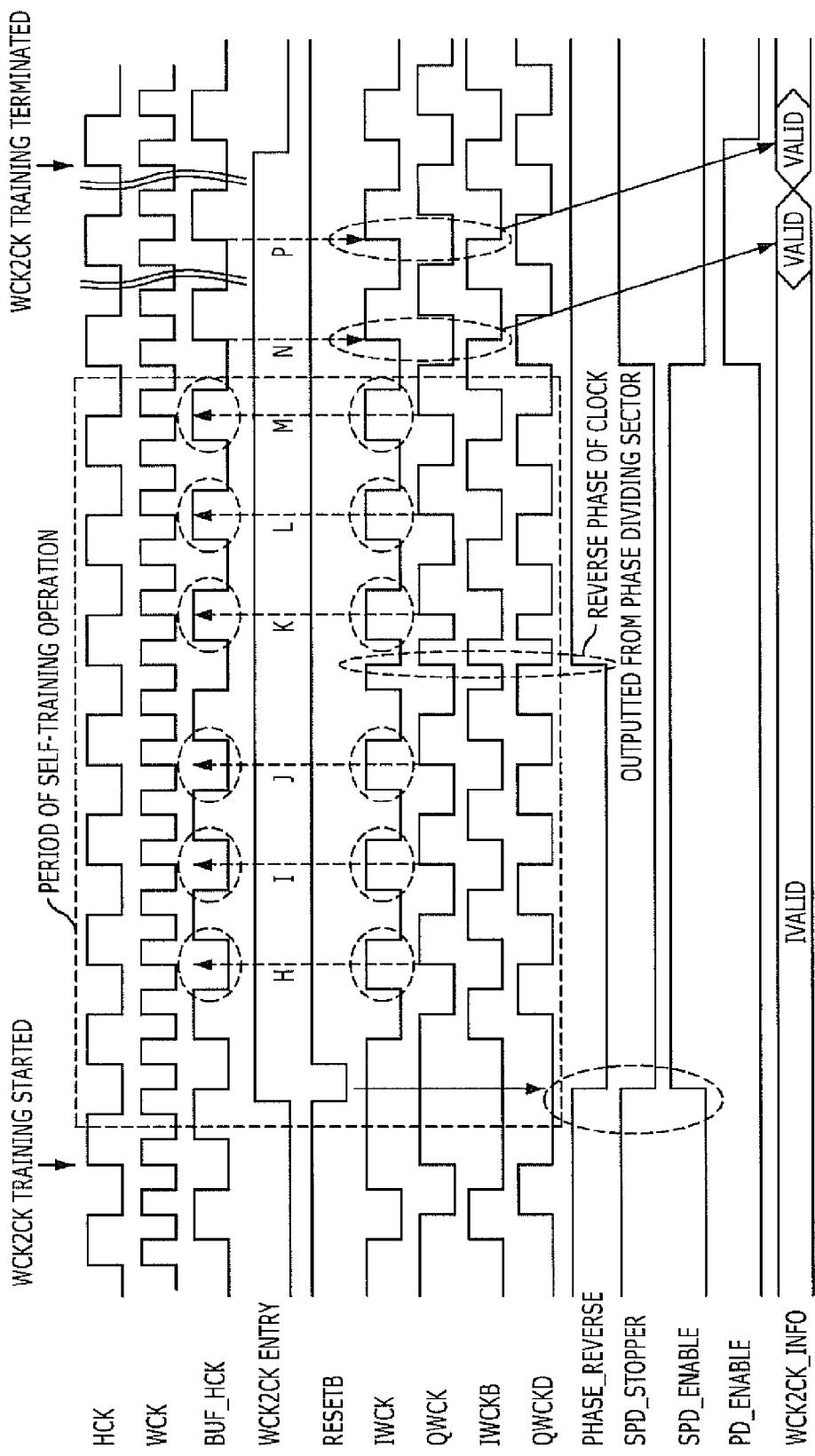
FIGS. 12 and 13 illustrate timing diagrams for explaining an operation of the circuit for performing the clock alignment training operation in accordance with the embodiment of the present invention described in FIG. 2, where the phases of the multi-phase data frequency division clocks IWCK, QWCK, IWCKB and QWCKB outputted from the phase dividing sector 224 should be reversed.

For instance, provided that the plurality of multi-phase data frequency division clocks has the phase difference of 90 degrees, respectively, i.e., IWCK, QWCK, IWCKB and QWCKB as shown in drawings, e.g., FIGS. 10 and 12, the first selected clock becomes a clock having the phase difference of 90 degrees (QWCK) or 270 degrees (QWCKB) with respect to the data frequency division clocks DIV_WCK and DIV_WCKB.

Provided that the plurality of multi-phase data frequency division clocks has the phase difference of 45 degrees, respectively, i.e., IWCK, IWCK45, QWCK, QWCK135, IWCKB, IWCKB225, QWCKB and QWCK315, the first selected clock becomes a clock having the phase difference of 45 degrees (IWCK45), 90 degrees (QWCK), 135 degrees (QWCK135), 225 degrees (IWCK225), 270 degrees (QWCKB) or 315 degrees (QWCK315) with respect to the data frequency division clocks DIV_WCK and DIV_WCKB.

The second selected clock IWCK or IWCKB is a clock whose phase is equal to or opposite to the phases of the data frequency division clocks DIV_WCK and DIV_WCKB.

For instance, provided that the plurality of multi-phase data frequency division clocks have the phase difference of 90 degrees, respectively, i.e., IWCK, QWCK, IWCKB and QWCKB as shown in drawings, e.g., FIGS. 10 and 12, the second selected clock becomes a clock having the phase difference of 0 degree (IWCK) or 180 degrees (IWCKB) with respect to the data frequency division clocks DIV_WCK and DIV_WCKB.

Although it is assumed that the plurality of multi-phase data divided clocks has the phase difference of 45 degrees, respectively, i.e., IWCK, IWCK45, QWCK, QWCK135, IWCKB, IWCKB225, QWCKB and QWCK315, the second selected clock becomes a clock having the phase difference of 0 degree (IWCK) or 180 degrees (IWCKB) with respect to the data frequency division clocks DIV_WCK and DIV_WCKB.

Figure 3:
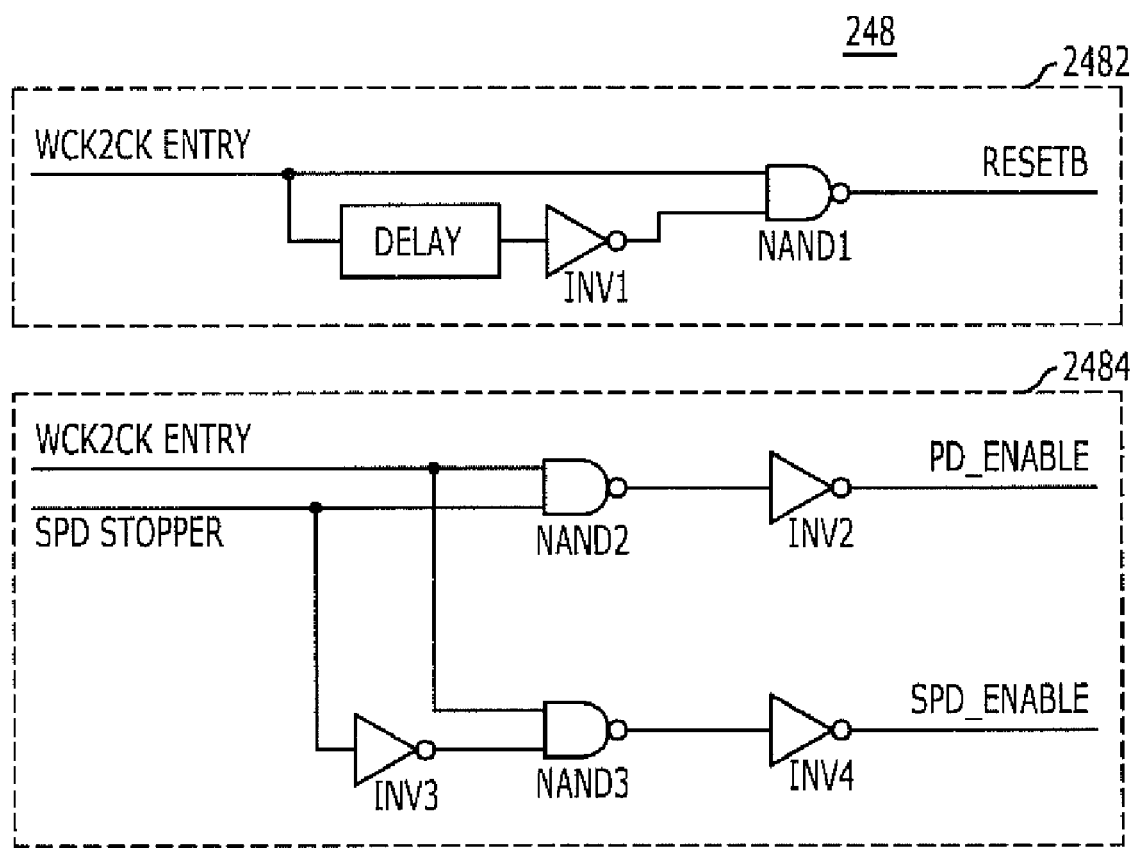
FIG. 3 illustrates a detailed circuit diagram of a training operation mode control sector included in a first phase detecting block among components of the circuit for performing the clock alignment training operation in accordance with the embodiment of the present invention described in FIG. 2.

FIG. 3 illustrates a detailed circuit diagram of the training operation mode control sector 248 included in the first phase detecting block 240 among the components of the circuit for performing the clock alignment training operation in accordance with the embodiment of the present invention described in FIG. 2.

Referring to FIG. 3, the training operation mode control sector 248 included in the first phase detecting block 240 includes a reset signal generating unit 2482 for producing the reset signal RESETB in response to the clock alignment training entry control signal WCK2CK ENTRY, a training mode enable signal generating unit 2484 for producing the normal training mode enable signal PD_ENABLE and the self-training mode enable signal SPD_ENABLE in response to the clock alignment training entry control signal WCK2CK ENTRY and the self-training mode disable signal SPD_STOPPER.

Herein, the reset signal generating unit 2482 includes a delay unit DELAY for delaying the clock alignment training entry control signal WCK2CK ENTRY by a predetermined time and outputting a delayed signal, an inverter INV1 for inverting a phase of the delayed signal outputted from the delay unit DELAY, and a NAND gate NAND1 for performing a negative logical product operation on an output signal of the inverter INV1 and the clock alignment training entry control signal WCK2CK ENTRY and outputting the logically combined signal as the reset signal RESETB.

That is, the reset signal generating unit 2482 generates the reset signal RESETB enabled to a logic low level for a predetermined time at a moment where the clock alignment training entry control signal WCK2CK ENTRY transits from a logic low level to a logic high level.

The training mode enable signal generating unit 2484 includes a first NAND gate NAND2 for performing a NAND operation on the clock alignment training entry control signal WCK2CK ENTRY and the self-training mode disable signal SPD_STOPPER, a first inverter INV2 for inverting a phase of a signal outputted from the first NAND gate NAND2 and outputting the inverted signal as the normal training mode enable signal PD_ENABLE, a second inverter INV3 for inverting the phase of the self-training mode disable signal SPD_STOPPER, a second NAND gate NAND3 for performing a NAND operation on the clock alignment training entry control signal WCK2CK ENTRY and an output signal of the second inverter INV3, and a third inverter INV4 for inverting a phase of a signal outputted from the second NAND gate NAND3 and outputting the inverted signal as the self-training mode enable signal SPD_ENABLE.

That is, the training mode enable signal generating unit 2484 enables the normal training mode enable signal PD_ENABLE to a logic high level and disables the self-training mode enable signal SPD_ENABLE to a logic low level when the self-training mode disable signal SPD_STOPPER is enabled to a logic high level in a state where the clock alignment training entry control signal WCK2CK ENTRY is enabled to a logic high level.

On the other hand, the training mode enable signal generating unit 2484 disables the normal training mode enable signal PD_ENABLE to a logic low level and enables the self-training mode enable signal SPD_ENABLE to a logic high level when the self-training mode disable signal SPD_STOPPER is disabled to a logic low level in a state where the clock alignment training entry control signal WCK2CK ENTRY is enabled to the logic high level.

The training mode enable signal generating unit 2484 disables both of the normal training mode enable signal PD_ENABLE and the self-training mode enable signal SPD_ENABLE to the logic low level regardless of a logic level of the self-training mode disable signal SPD_STOPPER in a state where the clock alignment training entry control signal WCK2CK ENTRY is disabled to a logic low level.

Figure 4:
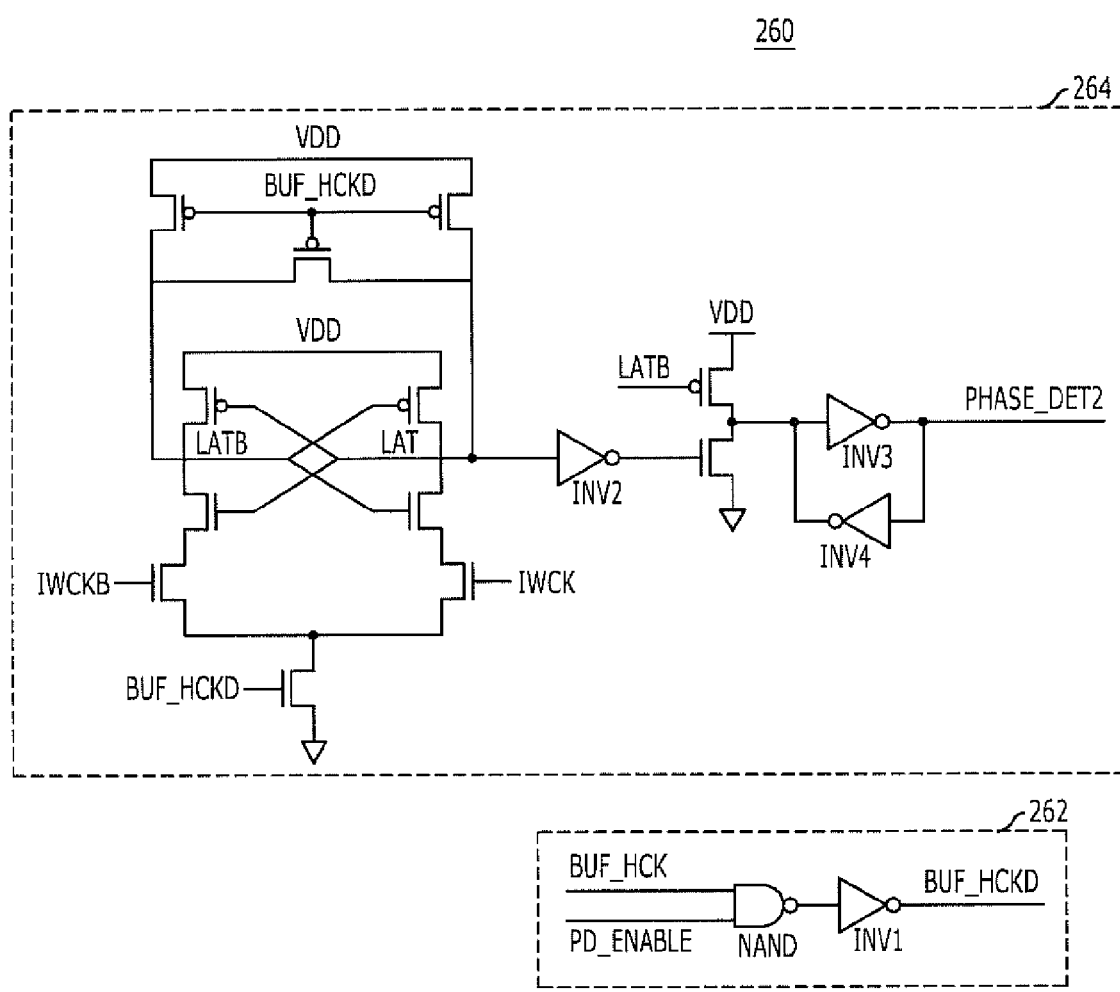
FIG. 4 illustrates a detailed circuit diagram of a second phase detecting block among the components of the circuit for performing the clock alignment training operation in accordance with the embodiment of the present invention described in FIG. 2.

FIG. 4 illustrates a detailed circuit diagram of the second phase detecting block 260 among the components of the circuit for performing the clock alignment training operation in accordance with the embodiment of the present invention described in FIG. 2.

Referring to FIG. 4, the second phase detecting block 260 includes a detecting operation control clock generating sector 262 for producing a detecting operation control clock BUF_HCKD in response to the normal training mode enable signal PD_ENABLE and the system clock BUF_HCK, a logic level detecting sector 264 for detecting a logic level of the second selected clock IWCK or IWCKB in response to the detection operation control clock BUF_HCKD.

Herein, the detecting operation control clock generating sector 262 includes a NAND gate NAND for performing a NAND operation on the normal training mode enable signal PD_ENABLE and the system clock BUF_HCK inputted thereto, and a first inverter INV1 for inverting a phase of a clock outputted from the NAND gate NAND and outputting the inverted clock as the detecting operation control clock BUF_HCKD.

That is, the detecting operation control clock generating sector 262 outputs the system clock BUF_HCK as the detecting operation control clock BUF_HCKD only when the normal training mode enable signal PD_ENABLE is enabled to a logic high level.

At this time, FIG. 4 shows the case where only the positive system clock BUF_HCK of the system clocks BUF_HCK and BUF_HCKB is used. However, this is only an exemplary embodiment and a designer may change the circuit to perform in other ways (for example, to use the negative system clock BUF_HCKD only).

The logic level detecting sector 264 receives the positive clock IWCK of the selected clocks IWCK and IWCKB through a first signal input node, the negative clock IWCKB of the selected clocks IWCK and IWCKB through a second signal input node and the detecting operation control clock BUF_HCKD through a clock input node, and determines a logic level of a signal PHASE_DET2 outputted by sensing and amplifying a difference of voltage levels of the positive clock IWCK and the negative clock IWCKB in a period where the detecting operation control clock BUF_HCKD is enabled.

For instance, if the voltage level of the positive clock IWCK is higher than the voltage level of the negative clock IWCKB in the period where the detecting operation control clock BUF_HCKD is enabled to a logic high level, the signal PHASE_DET2 is outputted to have a logic high level. At this time, the signal PHASE_DET2 maintains the logic high level even in a period where the detecting operation control clock BUF_HCKD is disabled to a logic low level.

On the other hand, if the voltage level of the positive clock IWCK is lower than the voltage level of the negative clock IWCKB in the period where the detecting operation control clock BUF_HCKD is enabled to the logic high level, the signal PHASE_DET2 is outputted to have a logic low level. At this time, the signal PHASE_DET2 maintains the logic low level even in the period where the detecting operation control clock BUF_HCKD is disabled to the logic low level.

FIG. 5 illustrates a detailed circuit diagram of the phase comparing sector 242 included in the first phase detecting block 240 among the components of the circuit for performing the clock alignment training operation in accordance with the embodiment of the present invention described in FIG. 2.

Referring to FIG. 5, the phase comparing sector 242 included in the first phase detecting block 240 includes a comparing operation control clock generating unit 2422 for producing a comparing operation control clock QWCKD in response to the self-training mode enable signal SPD_ENABLE and the first selected clock QWCK, and a logic level detecting unit 2424 for detecting logic levels of the system clocks BUF_HCK and BUF_HCKB in response to the comparing operation control clock QWCKD.

Herein, the comparing operation control clock generating unit 2422 includes a NAND gate NAND for performing a NAND operation on the self-training mode enable signal SPD_ENABLE and the first selected clock QWCK, and a first inverter INV1 for inverting a phase of a clock outputted from the NAND gate NAND and outputting the inverted clock as the comparing operation control clock QWCKD.

That is, the comparing operation control clock generating unit 2422 outputs the first selected clock QWCK as the comparing operation control clock QWCKD only when the self-training mode enable signal SPD_ENABLE is enabled to a logic high level.

At this time, FIG. 5 illustrates the case where only the positive clock QWCK of the first selected clocks QWCK and QWCKB is used. However, this is only an exemplary embodiment and a designer may change the circuit to use the negative clock QWCKB only.

The logic level detecting unit 2424 receives the positive system clock BUF_HCK of the system clocks BUF_HCK and BUF_HCKB through a first signal input node, the negative system clock BUF_HCKB of the systems clocks BUF_HCK and BUF_HCKB through a second signal input node and the comparing operation control clock QWCKD through a clock input node, and determines a logic level of the signal PHASE_DET1 outputted by sensing and amplifying a difference of voltage levels of the positive system clock BUF_HCK and the negative system clock HCKB in a period where the comparing operation control clock QWCKD is enabled.

For instance, if the voltage level of the positive system clock BUF_HCK is higher than the voltage level of the negative system clock BUF_HCKB in the period where the comparing operation control clock QWCKD is enabled to a logic high level, the signal PHASE_DET1 is outputted to have a logic high level. At this time, the signal PHASE_DET1 maintains the logic high state even in a period where the comparing operation control clock QWCKD is disabled to a logic low level.

On the other hand, if the voltage level of the positive system clock BUF_HCK is lower than the voltage level of the negative system clock BUF_HCKB in the period where the comparing operation control clock QWCKD is enabled to the logic high level, the signal PHASE_DET1 is outputted to have a logic low level. At this time, the signal PHASE_DET1 maintains the logic low level even in a period where the comparing operation control clock QWCKD is disabled to a logic low level.

Figure 6:
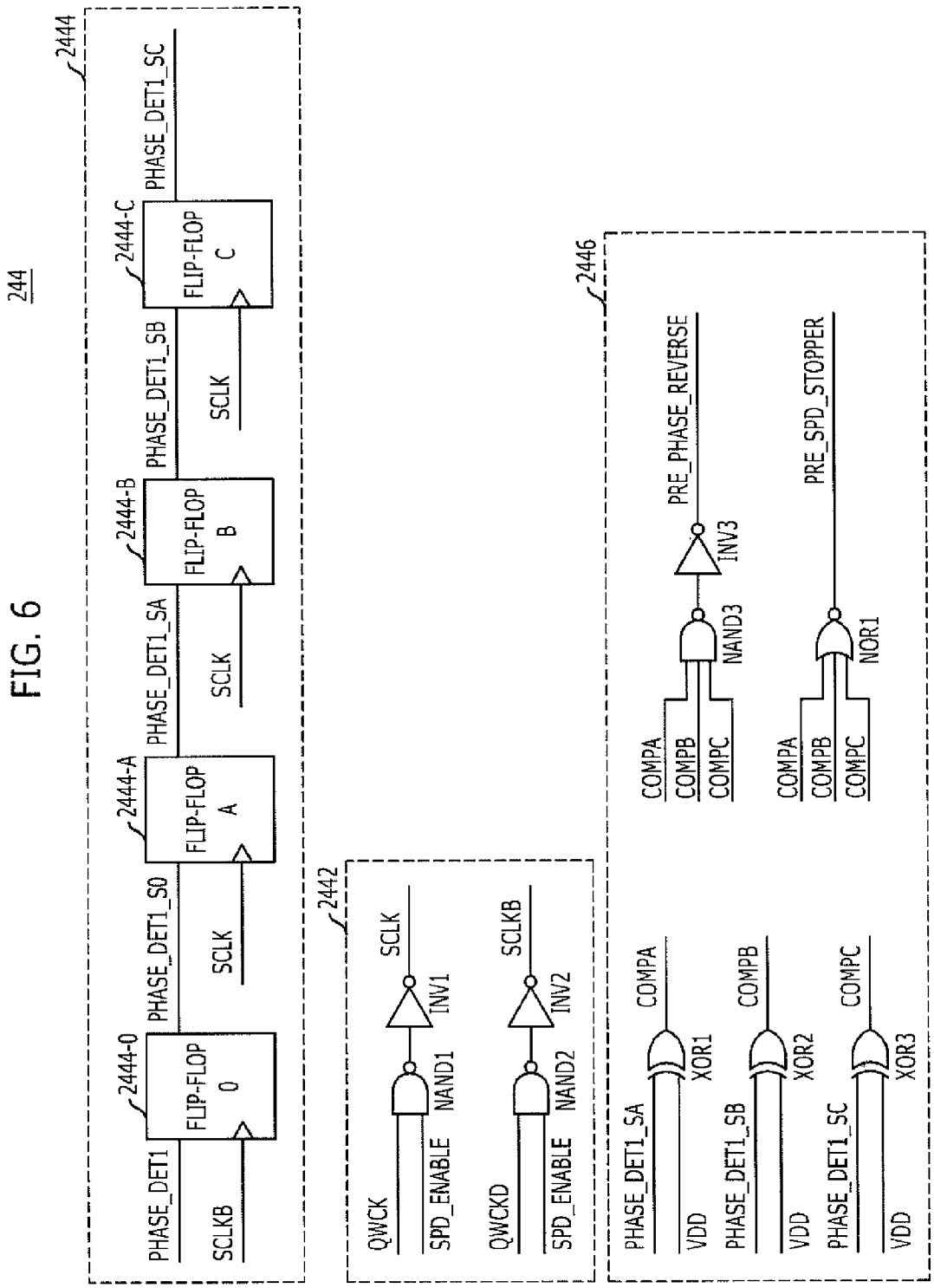
FIG. 6 illustrates a detailed circuit diagram of a logic level changing sector included in the first phase detecting block among the components of the circuit for performing the clock alignment training operation in accordance with the embodiment of the present invention described in FIG. 2.

FIG. 6 illustrates a detailed circuit diagram of the logic level changing sector 244 included in the first phase detecting block 240 among the components of the circuit for performing the clock alignment training operation in accordance with the embodiment of the present invention described in FIG. 2.

Referring to FIG. 6, the logic level changing sector 244 included in the first phase detecting block 240 includes a counting clock generating unit 2442 for producing counting clocks SCLK and SCLKB synchronized with the first selected clock QWCK or QWCKB in a period where the self-training mode enable signal SPD_ENABLE is enabled, a comparison information signal generating unit 2444 for producing a plurality of comparison information signals PHASE_DET1_S0, PHASE_DET1_SA, PHASE_DET1_SB and PHASE_DET1_SC whose logic levels are sequentially determined in response to the output signal PHASE_DET1 of the phase comparing sector 242 inputted based on the counting clocks SCLK and SCLKB, and a logic level determining unit 2446 for determining logic levels of the self-training mode disable signal SPD_STOPPER and the frequency division control signal PHASE_REVERSE in response to the plurality of comparison information signals PHASE_DET1_S0, PHASE_DET1_SA, PHASE_DET1_SB and PHASE_DET1_SC.

Herein, the counting clock generating unit 2442 includes a first NAND gate NAND1 for performing a negative logical product operation on the self-training mode enable signal SPD_ENABLE and the positive clock QWCK of the first selected clocks QWCK and QWCKB, a first inverter INV1 for outputting the positive counting clock SCLK of the counting clocks SCLK and SCLKB by inverting a phase of a clock outputted from the first NAND gate NAND1, a second NAND gate NAND2 for performing a negative logical product operation on the self-training mode enable signal SPD_ENABLE and the negative clock QWCKB of the first selected clocks QWCK and QWCKB, and a second inverter INV2 for outputting the negative counting clock SCLKB of the counting clocks SCLK and SCLKB by inverting a phase of a clock outputted from the second NAND gate NAND2.

That is, the counting clock generating unit 2442 toggles the counting clocks SCLK and SCLKB by being synchronized with the first selected clock QWCK or QWCKB in the period where the self-training mode enable signal SPD_ENABLE is enabled and does not toggle the counting clocks SCLK and SCLKB regardless of the first selected clock QWCK or QWCKB in a period where the self-training mode enable signal SPD_ENABLE is disabled.

The comparison information signal generating unit 2444 includes a plurality of flip-flops 2444-0 to 2444-C connected in a serial chain structure. Since the output signal PHASE_DET1 of the phase comparing sector 242 is inputted to the first flip-flop 2444-0 at each period corresponding to the counting clocks SCLK and SCLKB, the comparison information signals PHASE_DET1_S0, PHASE_DET1_SA, PHASE_DET1_SB and PHASE_DET1_SC are sequentially generated at the flip-flops 2444-0 to 2444-C in response to the toggling of the counting clocks SCLK and SCLKB.

That is, in the comparison information signal generating unit 2444, the first flip-flop 2444-0 receives the output signal PHASE_DET1 of the phase comparing sector 242 whenever the negative counting clock SCLKB of the counting clocks SCLK and SCLKB is toggled and outputs the received signal as the $0^{th}$ comparison information signal PHASE_DET1_S0 and the remaining flip-flops 2444-A to 2444-C sequentially receive the $0^{th}$ to second comparison information signals PHASE_DET1_S0 to PHASE_DET1_SB transmitted from their previous flip-flops 2444-0 to 2444-B, respectively, whenever the positive counting clock SCLK of the counting clocks SCLK and SCLKB is toggled and output the received signals as the first to the third comparison information signals PHASE_DET1_SA to PHASE_DET1_SC.

Therefore, the comparison information signals PHASE_DET1_S0, PHASE_DET1_SA, PHASE_DET1_SB and PHASE_DET1_SC are obtained by gathering the output signal PHASE_DET1 of the phase comparing sector 242 inputted to the comparison information signal generating unit 2444 while the counting clocks SCLK and SCLKB are toggled predetermined times.

The logic level determining unit 2446 includes a first exclusive-OR gate XOR1 for outputting a first comparison signal COMPA by performing an exclusive logical sum operation on a signal having a supply voltage (VDD) level and the first comparison information signal PHASE_DET1_SA, a second exclusive-OR gate XOR2 for outputting a second comparison signal COMPB by performing the exclusive logical sum operation on the signal having the VDD level and the second comparison information signal PHASE_DET1_SB, a third exclusive-OR gate XOR3 for outputting a third comparison signal COMPC by performing the exclusive logical sum operation on the signal having the VDD level and the third comparison information signal PHASE_DET1_SC, a NAND gate NAND3 for performing a NAND operation on the first to third comparison signals COMPA, COMPB and COMPC inputted thereto, an inverter INV3 for outputting the frequency division control signal PHASE_REVERSE by inverting a phase of a signal outputted from the NAND gate NAND3, and a NOR gate NOR1 for outputting the self-training mode disable signal SPD_STOP- PER by performing a NOR operation on the first to third comparison signals COMPA, COMPB and COMPC inputted thereto.

That is, the logic level determining unit 2446 disables both of the preliminary frequency division control signal and the self-training mode disable signal SPD_STOPPER to a logic low level when all of the comparison information signals PHASE_DET1_S0, PHASE_DET1_SA, PHASE_DET1_SB and PHASE_DET1_SC are enabled to a logic high level i.e., the counting clocks SCLK and SCLKB are sufficiently toggled.

Furthermore, the logic level determining unit 2446 disables the self-training mode disable signal SPD_STOPPER to a logic low level and enables the preliminary frequency division control signal PHASE_REVERSE to a logic high level when one or more of the comparison information signals PHASE_DET1_S0, PHASE_DET1_SA, PHASE_DET1_SB and PHASE_DET1_SC are enabled to a logic high level.

Moreover, the logic level determining unit 2446 enables both of the Signal PRE_PHASE_REVERSE and thus the frequency division control signal PHASE_REVERSE and the self-training mode disable signal SPD_STOPPER to a logic high level when all of the comparison information signals PHASE_DET1_S0, PHASE_DET1_SA, PHASE_DET1_SB and PHASE_DET1_SC are disabled to a logic low level.

Meanwhile, the logic level determining unit 2446 initializes both of the frequency division control signal PHASE_REVERSE and the self-training mode disable signal SPD_STOPPER to a logic low level in response the reset signal RESETB.

Figure 7:
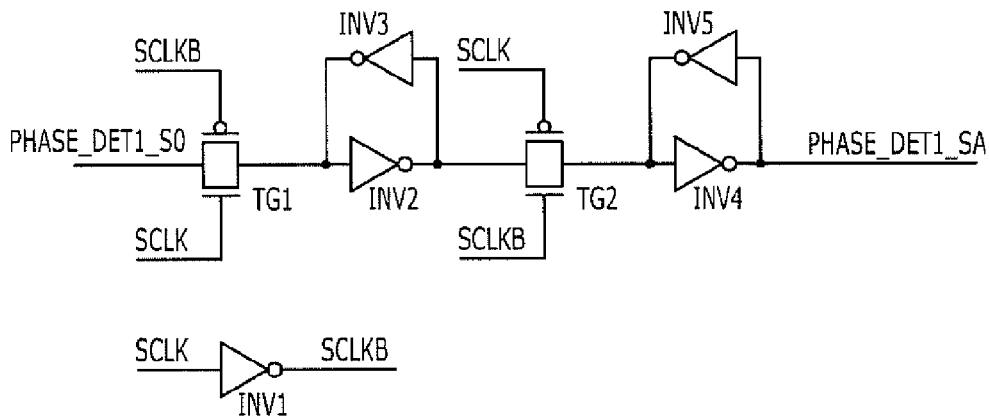
FIG. 7 illustrates a detailed circuit diagram of a plurality of flip-flops among components of the logic level changing sector described in FIG. 6.

FIG. 7 illustrates a detailed circuit diagram of the plurality of flip-flops 2444-0 to 2444-C of the components of the logic level changing sector 244 described in FIG. 6.

Herein, FIG. 7 illustrates a detailed circuit diagram of only the flip-flop 2444-A among the plurality of flip-flops 2444-0 to 2444-C since the remaining flip-flops 2444-0, 2444-B and 2444-C have practically the same construction as that of the flip-flop 2444-A except that the names of signals inputted thereto and signals outputted therefrom are different from those of the flip-flop 2444-A.

Referring to FIG. 7, the flip-flops 2444-A in FIG. 6 includes a first transmission gate TG1 for controlling the transmission of the signal PHASE_DET1_S0 inputted through a signal input node in response to the negative counting clock SCLKB inputted through a negative input node and the positive counting clock SCLK inputted through a positive input node thereof, first inverters INV2 and INV3 connected in a latch structure to maintain a logic level of a signal transferred through the first transmission gate TG1, a second transmission gate TG2 for controlling the transmission of a signal outputted from the first inverters INV2 and INV3 in response to the negative counting clock SCLKB inputted through a positive input node and the positive counting clock SCLK inputted through a negative input node thereof, and second inverters INV4 and INV5 connected in the latch structure to output the signal PHASE_DET1_SA through a signal output node by maintaining a logic level of a signal transferred through the second transmission gate TG2.

That is, the flip-flop 2444-A described in FIG. 6 receives the comparison information signal PHASE_DET1_S0 from its previous flip-flop, e.g., the flip-flop 2444-0, in a predetermined period where the counting clocks SCLK and SCLKB are enabled, i.e., the positive counting clock SCLK has a logic high level and the negative counting clock SCLKB has a logic low level, and outputs the corresponding comparing information signal PHASE_DET1_SA in a predetermined period where the counting clocks SCLK and SCLKB are disabled, i.e., the positive counting clock SCLK has a logic low level and the negative counting clock SCLKB has a logic high level.

Therefore, the signal PHASE_DET1 and the comparison information signals PHASE_DET1_S0, PHASE_DET1_SA and PHASE_DET1_SB inputted to the plurality of flip-flops 2444-0 to 2444-C described in FIG. 6, respectively, perform an operation of maintaining their logic levels during one period 1tck of the counting clocks SCLK and SCLKB.

Figure 8:
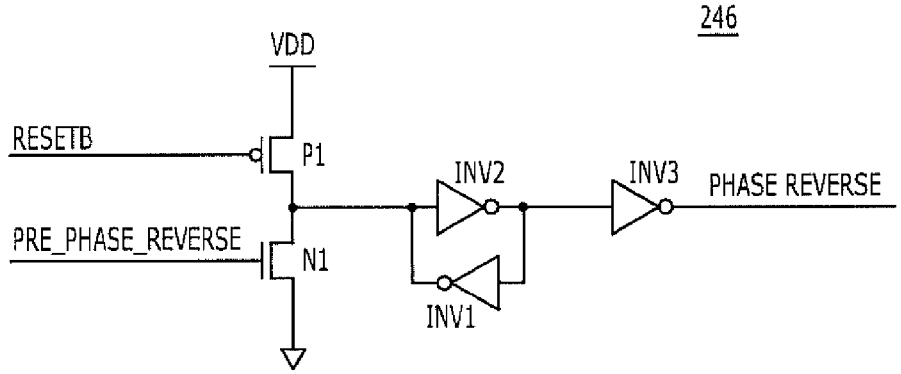
FIG. 8 illustrates a detailed circuit diagram of a frequency division control signal initializing sector included in the first phase detecting block among the components of the circuit for performing the clock alignment training operation in accordance with the embodiment of the present invention described in FIG. 2.

FIG. 8 illustrates a detailed circuit diagram of the frequency division control signal initializing sector 246 included in the first phase detecting block 240 among the components of the circuit for performing the clock alignment training operation in accordance with the embodiment of the present invention described in FIG. 2.

Referring to FIG. 8, the frequency division control signal initializing sector 246 included in the first phase detecting block 240 includes a PMOS transistor P1 and an NMOS transistor N1 connected in series between a power supply (VDD) terminal and a ground voltage (VSS) terminal. The PMOS transistor P1 performs an operation of connecting the VDD terminal connected to its source and a connection node of the PMOS transistor P1 and the NMOS transistor N1 in response to the reset signal RESETB inputted through its gate. The NMOS transistor N1 performs an operation of connecting the connection node of the PMOS transistor P1 and the NMOS transistor N1 and the VSS terminal connected to its source in response to the preliminary frequency division control signal PHASE_REVERSE inputted through its gate. Thus, the frequency division control signal PHASE_REVERSE outputted through the connection node of the PMOS transistor P1 and the NMOS transistor N1 may be initialized in a certain condition in response to the reset signal RESETB, wherein the certain condition is a state where the reset signal RESETB is enabled to a logic low level. At this time, inverters INV1 and INV2 connected in a latch structure are further connected to the connection node of the PMOS transistor P1 and the NMOS transistor N1 to prevent the frequency division control signal PHASE_REVERSE from being in a floating state.

That is, the frequency division control signal initializing sector 246 included in the first phase detecting block 240 disables the frequency division control signal PHASE_REVERSE to a logic low level at the moment where the reset signal RESETB is enabled to the logic low level regardless of a current logic level of the preliminary frequency division control signal PRE_PHASE_REVERSE.

Figure 9:
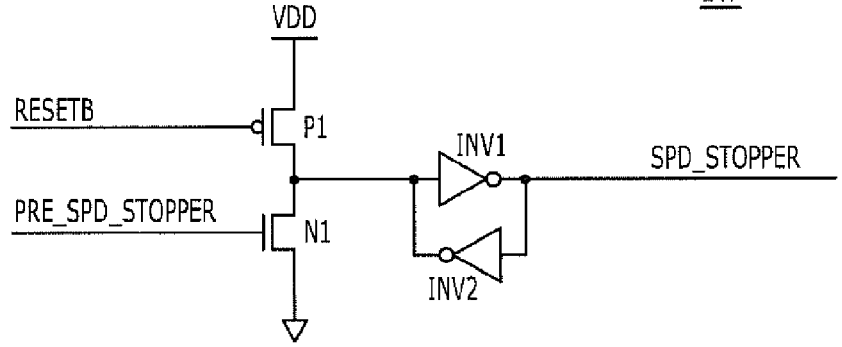
FIG. 9 illustrates a detailed circuit diagram of a self-training mode disable signal initializing sector included in the first phase detecting block among the components of the circuit for performing the clock alignment training operation in accordance with the embodiment of the present invention described in FIG. 2.

FIG. 9 illustrates a detailed circuit diagram of the self-training mode disable signal initializing sector 247 included in the first phase detecting block 240 among the components of the circuit for performing the clock alignment training operation in accordance with the embodiment of the present invention described in FIG. 2.

Referring to FIG. 9, the self-training mode disable signal initializing sector 247 of the first phase detecting block 240 includes a PMOS transistor P1 and an NMOS transistor N1 connected in series between the VDD terminal and the VSS terminal. The PMOS transistor P1 performs an operation of connecting the VDD terminal connected to its source and a connection node of the PMOS transistor P1 and the NMOS transistor N1 in response to the reset signal RESETB inputted through its gate. The NMOS transistor N1 performs an operation of connecting the connection node of the PMOS transistor P1 and the NMOS transistor N1 and the VSS terminal connected to its source in response to the self-training mode disable signal SPD_STOPPER inputted through its gate. Thus, the self-training mode disable signal SPD_STOPPER outputted through the connection node of the PMOS transistor P1 and the NMOS transistor N1 may be initialized in a certain condition in response to the reset signal RESETB, wherein the certain condition is a state where the reset signal RESETB is enabled to a logic low level. At this time, inverters INV1 and INV2 connected in a latch structure are further connected to the connection node of the PMOS transistor P1 and the NMOS transistor N1 to prevent the self-training mode disable signal SPD_STOPPER from being in a floating state.

That is, the self-training mode disable signal initializing sector 247 included in the first phase detecting block 240 disables the self-training mode disable signal SPD_STOPPER to a logic low level at the moment where the reset signal RESETB is enabled to the logic low level regardless of a current logic level of the self-training mode disable signal SPD_STOPPER.

Figure 11:
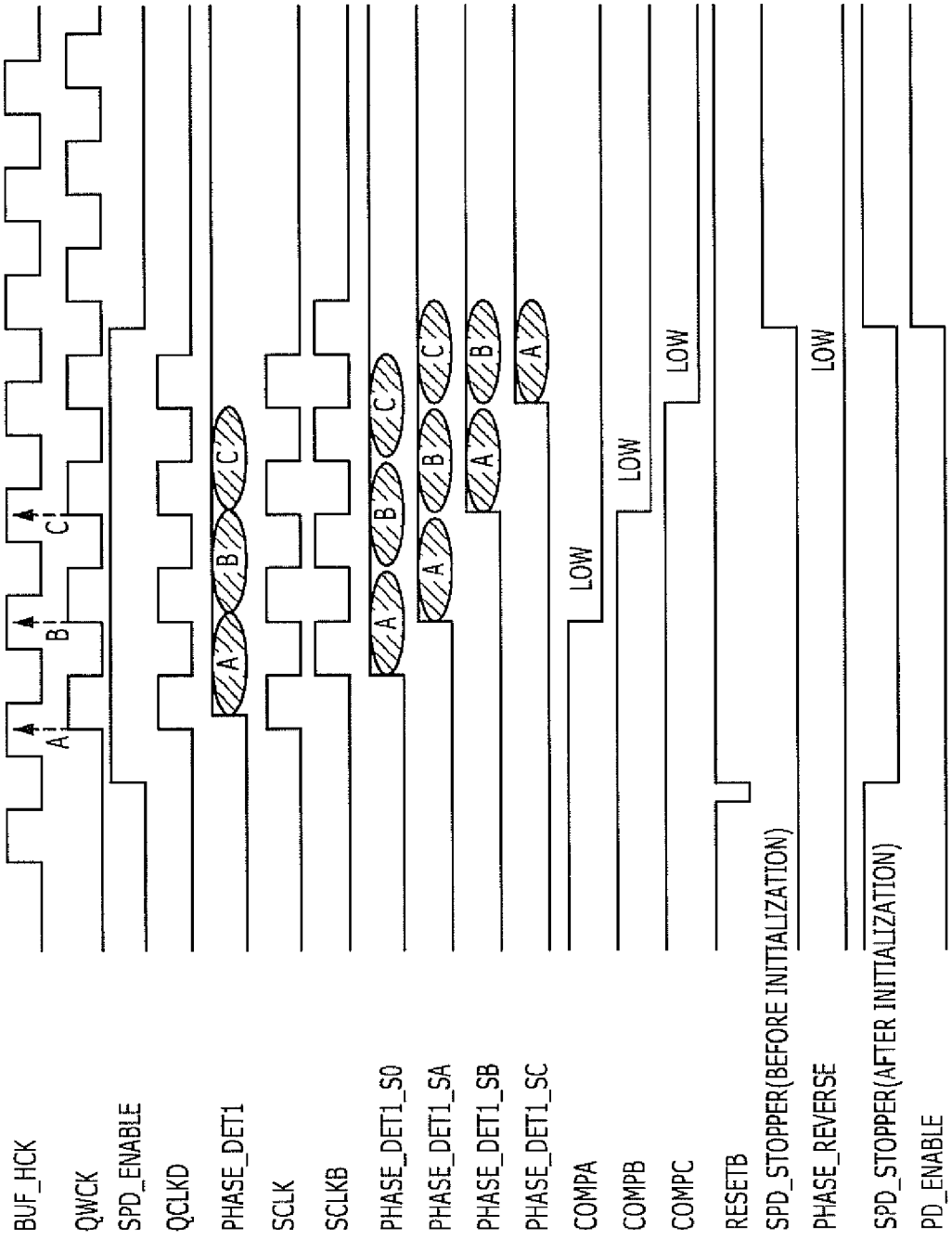

FIGS. 10 and 11 illustrate timing diagrams for explaining an operation of the circuit for performing the clock alignment training operation in accordance with the embodiment of the present invention described in FIG. 2, where there is no need to reverse the phases of the multi-phase data frequency division clocks IWCK, QWCK, IWCKB and QWCKB outputted from the phase dividing sector 224.

For reference, the timing diagrams described in FIGS. 10 and 11 represent the case where there is no need to reverse the phases of the multi-phase data frequency division clocks IWCK, QWCK, IWCKB and QWCKB outputted from the phase dividing sector 224 since the multi-phase data frequency division clocks IWCK, QWCK, IWCKB and QWCKB have phases of 0 degree (IWCK), 90 degrees (QWCK), 180 degrees (IWCKB) and 270 degrees (QWCKB) sequentially in comparison to the phase of the positive data clock WCK.

Referring to FIGS. 10 and 11, the clock alignment training operation starts as the clock alignment training entry control signal WCK2CK ENTRY is enabled. That is, the reset signal RESETB is toggled as the clock alignment training entry control signal WCK2CK ENTRY transits to an enable state of a logic high level from a disable state of a logic low level and thus the clock alignment training operation starts as the frequency division control signal PHASE_REVERSE, the self-training mode enable signal SPD_ENABLE, the self-training mode disable signal SPD_STOPPER and the normal training mode enable signal PD_ENABLE transit to initial logic levels.

At this point, it is noticed that the self-training operation also starts as the clock alignment training operation starts. This is because, as the reset signal RESETB is toggled, the self-training mode enable signal SPD_ENABLE is enabled to a logic high level; the self-training mode disable signal SPD_STOPPER is disabled to a logic low level; and the normal training mode enable signal PD_ENABLE is disabled to a logic low level.

Like this, if the self-training operation starts, the logic level of the system clock BUF_HCK is detected based on the first selected clock QWCK among the multi-phase data frequency division clocks IWCK, QWCK, IWCKB and QWCKB, referring to reference symbols A, B and C in FIG. 10. Thereafter, the logic levels of the comparison information signals PHASE_DET1_S0, PHASE_DET1_SA, PHASE_DET1_SB and PHASE_DET1_SC are sequentially determined.

That is, in FIG. 11, the logic level of the first comparison information signal PHASE_DET1_SA becomes a logic high level for each period of the counting clocks SCLK and SCLKB synchronized to the first selected clock QWCK or QWCKB and then the logic level of the second comparison information signal PHASE_DET1_SB becomes a logic high level. Subsequently, the logic level of the comparison information signal PHASE_DET1_SC becomes a logic high level.

Since it is noticed that when all of the comparison information signals PHASE_DET1_S0, PHASE_DET1_SA, PHASE_DET1_SB and PHASE_DET1_SC have a logic high level, the logic level of the frequency division control signal PHASE_REVERSE is maintained as the initial logic low level and, at the same time, the self-training mode disable signal SPD_STOPPER transits from the logic low level to the logic high level.

Like this, after the logic level of the preliminary frequency division control signal PRE_PHASE_REVERSE is determined, the preliminary self-training mode disable signal PRE_SPD_STOPPER is enabled to the logic high level; the self-training mode enable signal SPD_ENABLE is disabled to the logic low level; and the normal training mode enable signal PD_ENABLE is enabled to the logic high level. As a result, the self-training operation is terminated and the normal training operation starts.

After then, in the normal training operation, the logic level of the second selected clock IWCK or IWCKB among the multi-phase data frequency division clocks IWCK, QWCK, IWCKB and QWCKB is detected based on the system clocks BUF_HCK and BUF_HCKB likewise in the prior art, referring to reference symbols D, is E and F in FIG. 10, and a logic level of the training information signal WCK2CK_INFO is determined according to the detected result.

Figure 13:
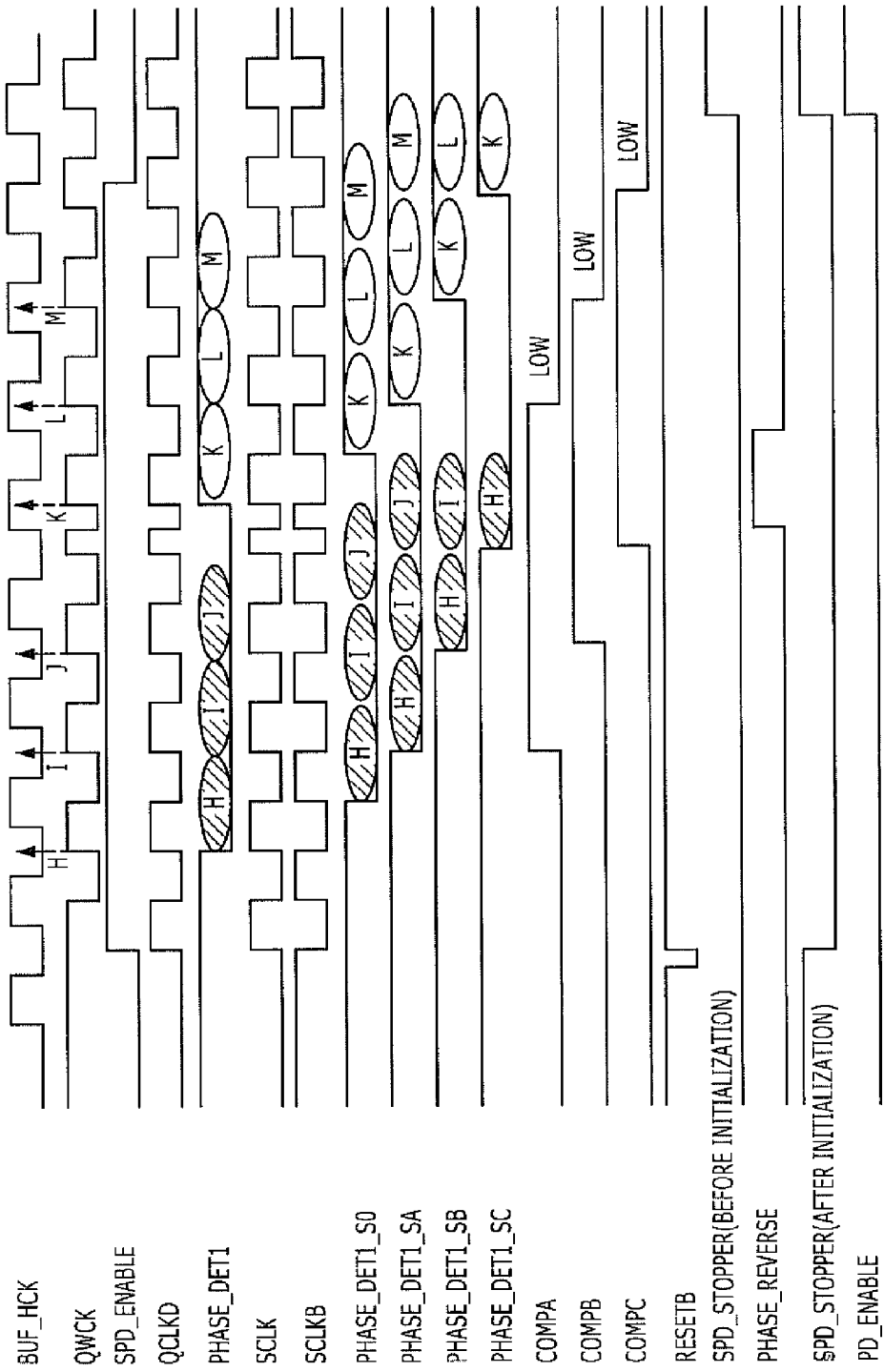

FIGS. 12 and 13 illustrate timing diagrams for explaining an operation of the circuit for performing the clock alignment training operation in accordance with the embodiment of the present invention described in FIG. 2, where the phases of the multi-phase data frequency division clocks IWCK, QWCK, IWCKB and QWCKB outputted from the phase dividing sector 224 should be reversed.

For reference, the timing diagrams described in FIGS. 12 and 13 represent the case where the phases of the multi-phase data frequency division clocks IWCK, QWCK, IWCKB and QWCKB outputted from the phase dividing sector 224 should be reversed since the multi-phase data frequency division clocks IWCK, QWCK, IWCKB and QWCKB have phases of 180 degrees (IWCK), 270 degrees (QWCK), 0 degree (IWCKB) and 90 degrees (QWCKB) sequentially in comparison to the phase of the positive data clock WCK.

Referring to FIGS. 12 and 13, it is noticed that the clock alignment training operation starts as the clock alignment training entry control signal WCK2CK ENTRY is enabled. That is, the reset signal RESETB is toggled as the clock alignment training entry control signal WCK2CK ENTRY transits to the enable state of the logic high level from the disable state of the logic low level and thus the clock alignment training operation starts as the frequency division control signal PHASE_REVERSE, the self-training mode enable signal is SPD_ENABLE, the self-training mode disable signal SPD_STOPPER and the normal training mode enable signal PD_ENABLE transit to the initial logic levels.

At this point, it is noticed that the self-training operation also starts as the clock alignment training operation starts. This is because, as the reset signal RESETB is toggled, the self-training mode enable signal SPD_ENABLE is enabled to the logic high level; the self-training mode disable signal SPD_STOPPER is disabled to the logic low level, and the normal training mode enable signal PD_ENABLE is also disabled to the logic low level.

Like this, if the self-training operation starts, the logic level of the system BUF_HCK is detected based on the first selected clock QWCK among the multi-phase data frequency division clocks IWCK, QWCK, IWCKB and QWCKB, referring to reference symbols H, I and J in FIG. 12. Thereafter, the logic levels of the comparison information signals PHASE_DET1_S0, PHASE_DET1_SA, PHASE_DET1_SB and PHASE_DET1_SC are sequentially determined.

That is, in FIG. 13, the logic level of the first comparison information signal PHASE_DET1_SA becomes a logic low level for each period of the counting clocks SCLK and SCLKB synchronized to the first selected clock QWCK or QWCKB and then the logic level of the second comparison information signal PHASE_DET1_SB becomes a logic low level. Subsequently, the logic level of the comparison information signal PHASE_DET1_SC becomes a logic low level.

Since it is noticed that all of the comparison information signals PHASE_DET1_S0, PHASE_DET1_SA, PHASE_DET1_SB and PHASE_DET1_SC have the logic low level when the logic levels of all of the comparison information signals PHASE_DET1_S0, PHASE_DET1_SA, PHASE_DET1_SB and PHASE_DET1_SC are determined, the logic level of the frequency division control signal PHASE_REVERSE transits from the logic low level to the logic high level and, at the same time, the self-training mode disable signal SPD_STOPPER maintains the logic low level.

Like this, since the logic level of the frequency division control signal PHASE_REVERSE transits from the logic low level to the logic high level, the phases of the multi-phase data frequency division clocks IWCK, QWCK, IWCKB and QWCKB outputted from the phase dividing sector 224 are reversed and thus the multi-phase data frequency division clocks IWCK, QWCK, IWCKB and QWCKB sequentially become to have phases of 0 degree (IWCK), 90 degrees (QWCK), 180 degrees (IWCKB) and 270 degrees (QWCKB) in comparison to the phase of the positive data clock WCK.

Moreover, as the logic level of the frequency division control signal PHASE_REVERSE becomes the logic high level and the self-training mode disable signal SPD_STOPPER maintains the disable state of the logic low level, the self-training mode enable signal SPD_ENABLE continuously maintains the enable state of the logic high level and thus the self-training mode operation is continuously performed without being terminated.

Therefore, the logic level of the system clock BUF_HCK is detected based on the first selected clock QWCK among the multi-phase data frequency division clocks IWCK, QWCK, IWCKB and QWCKB, referring to reference symbols K, L and M in FIG. 12, and the logic levels of the comparison information signals PHASE_DET1_S0, PHASE_DET1_SA, PHASE_DET1_SB and PHASE_DET1_SC are sequentially decided.

That is, in FIG. 12, the logic level of the first comparison information signal PHASE_DET1_SA becomes the logic high level for each period of the counting clocks SCLK and SCLKB synchronized to the first selected clock QWCK or QWCKB and then the logic level of the second comparison information signal PHASE_DET1_SB becomes the logic high level. Subsequently, the logic level of the comparison information signal PHASE_DET1_SC becomes the logic high level.

When all of the comparison information signals PHASE_DET1_S0, PHASE_DET1_SA, PHASE_DET1_SB and PHASE_DET1_SC have the logic high level and the frequency division control signal PHASE_REVERSE maintains the logic high level previously determined, the self-training mode disable signal SPD_STOPPER is enabled to the logic high level. Thereafter, the self-training mode enable signal SPD_ENABLE is disabled to the logic low level and the normal training mode enable signal PD_ENABLE is enabled to the logic high level. As a result, the self-training operation is terminated and the normal training operation starts.

After then, in the normal training operation, the logic level of the second selected clock IWCK or IWCKB among the multi-phase data frequency division clocks IWCK, QWCK, IWCKB and QWCKB is detected based on the system clocks BUF_HCK and BUF_HCKB likewise in the prior art, referring to the reference symbols K, L and M in FIG. 12, and the logic level of the training information signal WCK2CK_INFO is determined according to the detected result.

As described in the above embodiments of the present invention, as the self-training operation is included in the clock alignment training operation, it is possible to determine whether or not the phases of the multi-phase data frequency division clocks IWCK, QWCK, IWCKB and QWCKB are reversed in response to the frequency division control signal PHASE_REVERSE in the process of generating the multi-phase data frequency division clocks IWCK, QWCK, IWCKB and QWCKB having the predetermined phase difference by dividing the frequency of the data clocks BUF_WCK and BUF_WCKB, and thus to generate the multi-phase data frequency division clocks IWCK, QWCK, IWCKB and QWCKB having the phases determined according to the predetermined order in comparison to the phases of the data clocks BUF_WCK and BUF_WCKB.

Therefore, it is possible to maintain a time required in performing the clock alignment training operation at the minimum.

While the present invention has been described with respect to the specific embodiments, it will be apparent to those skilled in the art that various changes and modifications may be made without departing from the spirit and scope of the invention as defined in the following claims.

For instance, in the above embodiments, the logic level changing sector 244 performs an operation of changing the logic level of the frequency division control signal PHASE_REVERSE in response to a state where the signal PHASE_DET1 outputted from the phase comparing sector 242 has the same logic level for 3 periods continuously. However, in accordance with another embodiment of the present invention, the logic level of the frequency division control signal PHASE_REVERSE may be changed in response to a state where the signal PHASE_DET1 outputted from the phase comparing sector 242 has the same logic level for less or more than 3 periods continuously.

Moreover, for instance, in the above embodiments, the illustrated logic gates and transistors may be implemented to have different locations and types according to polarities of signals inputted thereto.

What is claimed is:

1. A semiconductor device, comprising:
a clock input block to receive a system clock and a data clock;
a clock frequency dividing block to generate a plurality of multi-phase data frequency division clocks each of which has the phase difference of a predetermined size by dividing a frequency of the data clock and to determine whether or not phases of the plurality of multi-phase data frequency division clocks are to be reversed in response to a frequency division control signal; and a first phase detecting block to detect a phase of the system clock based on a phase of a first selected clock that is predetermined among the plurality of multi-phase data frequency division clocks and to determine a logic level of the frequency division control signal in response to the detected result.

2. The semiconductor device of claim 1, further comprising:
a second phase detecting block to detect the phase of the system clock based on a phase of a second selected clock that is selected among the plurality of multi-phase data frequency division clocks and to generate a training information signal in response to the detected result; and
a signal transmitting block to transfer the training information signal to the outside.

3. The semiconductor device of claim 2, wherein the clock input block comprises:
a system clock generating sector to receive a clock for synchronizing input points of an address signal and a command signal received from the outside and to output the received clock as the system clock; and
a data clock generating sector to receive a clock for synchronizing input points of data signals and to output the received clock as the data clock.

4. The semiconductor device of claim 2, where the clock frequency dividing block comprises:
a frequency dividing sector to generate a data frequency division clock by dividing the frequency of the data clock; and
a phase dividing sector to generate the plurality of multi-phase data frequency division clocks in response to the data frequency division clock and to determine whether or not the plurality of multi-phase data frequency division clocks is to be reversed in response to the frequency division control signal.

5. The semiconductor device of claim 4, wherein the phase dividing sector reverses the phases of the plurality of multi-phase data frequency division clocks when the frequency division control signal is enabled and does not reverse the phases of the plurality of multi-phase data frequency division clocks when the frequency division control signal is disabled.

6. The semiconductor device of claim 5, wherein the first selected clock is a multi-phase data frequency division clock whose phase is not equal to and opposite to a phase of the data frequency division clock among the plurality of multi-phase data frequency division clocks.

7. The semiconductor device of claim 6, wherein the second selected clock is a multi-phase data frequency division clock whose phase is equal to or opposite to the phase of the data frequency division clock among the plurality of multi-phase data frequency division clocks.

8. The semiconductor device of claim 2, wherein the first phase detecting block comprises:
a phase comparing sector to compare the phase of the first selected clock with the phase of the system clock; and
a logic level changing sector to repeatedly receive an output signal of the phase comparing sector predetermined number of times and to change logic levels of a self-training mode disable signal and the frequency division control signal based on the received signals.

9. The semiconductor device of claim 8, wherein the logic level changing sector changes the logic levels of the self-training mode disable signal and the frequency division control signal in response the output signal of the phase comparing sector repeatedly inputted thereto for the predetermined times in a period where a self-training mode enable signal enabled in response to the starting of a clock alignment training operation maintains its enable state.

10. The semiconductor device of claim 9, wherein the logic level changing sector comprises:
a counting clock generating unit to generate a counting clock synchronized to the first selected clock in the period where the self-training mode enable signal maintains its enable state;
a comparison information signal generating unit to generate a plurality of comparison information signals whose logic levels are sequentially determined in response to the output signal of the phase comparing sector that is inputted at each period corresponding to the counting clock; and
a logic level determining unit to determine the logic levels of the frequency division control signal and the self-training mode disable signal in response to the plurality of comparison information signals.

11. The semiconductor device of claim 10, wherein the comparison information signal generating unit comprises a multiplicity of flip-flops, wherein the output signal of the phase comparing sector is inputted to the first one of the multiplicity of flip-flops at each period corresponding to the counting clock and the plurality of comparison information signals is sequentially generated from the multiplicity of flip-flops in response to the toggling of the counting clock.

12. The semiconductor device of claim 10, wherein, when all of the logic levels of the plurality of comparison information signals are determined, the logic level determining unit disables the frequency division control signal and the self-training mode disable signal when all of the plurality of comparison information signals are enabled, enables the frequency division control signal and disables the self-training mode disable signal when one or more of the plurality of comparison information signals are enabled although all of the plurality of comparison information signals are not enabled, and enables the frequency division control signal and the self-training mode disable signal when all of the plurality of comparison information signals are disabled.

13. The semiconductor device of claim 12, wherein the logic level determining unit initializes the frequency division control signal and the self-training mode disable signal to a disable state in response to a reset signal.

14. The semiconductor device of claim 13, wherein the first phase detecting block further comprises a training operation mode control sector to determine logic levels of the self-training mode enable signal, a normal training mode enable signal and the reset signal in response to the self-training mode disable signal and a clock alignment training entry control signal that is enabled in response to the starting of the clock alignment training operation.

15. The semiconductor device of claim 14, wherein the first phase detecting block operates when the self-training mode enable signal is enabled, and the second phase detecting block and the signal transmitting block operate when the normal training mode enable signal is enabled.

16. The semiconductor device of claim 15, wherein a period and a timing where the clock alignment training entry control signal is enabled are defined in a mode register set (MRS).

17. A method for operating a semiconductor device, the method comprising:
receiving a system clock and a data clock;
generating a plurality of multi-phase data frequency division clocks each of which has the phase difference of a predetermined size by dividing a frequency of the data clock and determining whether or not phases of the plurality of multi-phase data frequency division clocks are reversed in response to a frequency division control signal;

sensing normal training mode entry or self-training mode entry; and detecting a phase of the system clock based on a phase of a first selected clock that is predetermined among the plurality of multi-phase data frequency division clocks in case of entering the self-training mode according to the sensed result and determining a logic level of the frequency division control signal in response to the detected result.

18. The method of claim 17, further comprising:

detecting the phase of the system clock based on a phase of a second selected clock that is selected among the plurality of multi-phase data frequency division clocks in case of entering the normal training mode according to the sensed result and determining a logic level of a training information signal in response to the detected result; and transmitting the training information signal to the outside.

19. The method of claim 18, wherein the generating of the plurality of multi-phase data frequency division clocks comprises:

generating a data frequency division clock by dividing the frequency of the data clock;

generating the plurality of multi-phase data frequency division clocks whose phases are reversed in response to the enabling of the frequency division control signal; and generating the plurality of multi-phase data frequency division clocks whose phases are not reversed in response to the disabling of the frequency division control signal.

20. The method of claim 19, wherein the first selected clock is a multi-phase data frequency division clock whose phase is not equal to and opposite to a phase of the data frequency division clock among the plurality of multi-phase data frequency division clocks.

21. The method of claim 20, wherein the second selected clock is a multi-phase data frequency division clock whose phase is equal to or opposite to the phase of the data frequency division clock among the plurality of multi-phase data frequency division clocks.

22. The method of claim 18, wherein the determining of the logic level of the frequency division control signal comprises:

comparing a phase of the first selected clock and the phase of the system clock in case of entering the self-training mode; and repeatedly receiving a signal outputted from the phase comparing operation predetermined times in case of entering the self-training mode and changing logic levels of the frequency division control signal and a self-training mode disable signal in response to the result of the receiving of the signal outputted from the phase comparison operation.

23. The method of claim 22, wherein the changing of the logic level of the frequency division control signal changes the logic levels of the frequency division control signal and the self-training mode disable signal in response to an output signal of an operation of comparing the phases of the signal repeatedly inputted in a period where a self-training mode enable signal maintains its enable state in a state of entering the self-training mode.

24. The method of claim 23, wherein the changing of the logic level of the frequency division control signal comprises:

generating a counting clock synchronized to the first selected clock in a period where the self-training mode enable signal is enabled after entering the self-training mode;

repeatedly receiving the signal outputted from the phase comparison operation at every point corresponding to the counting clock and generating a plurality of comparison information signals whose logic levels are sequentially determined in response to the received signals; and deciding the logic levels of the self-training mode disable signal and the frequency division control signal in response to the plurality of comparison information signals.

25. The method of claim 24, wherein the generating of the plurality of comparison information signals comprises:

repeatedly receiving the signal outputted from the phase comparison operation at each triggering of the counting clock; and sequentially deciding the logic levels of the plurality of in comparison information signals in response to the signals outputted from the phase comparison operation sequentially inputted through the repeatedly receiving operation.

26. The method of claim 25, wherein the deciding of the logic levels of the self-training mode disable signal and the frequency division control signal comprises:

disabling both of the frequency division control signal and the self-training mode disable signal in case all of the plurality of comparison information signals are enabled when all of the logic levels of the plurality of comparison information signals are determined;

enabling the frequency division control signal and disabling the self-training mode disable signal in case where one or more but not all of the plurality of comparison information signals are enabled when all of the logic levels of the plurality of comparison information signals are determined; and enabling both of the frequency division control signal and the self-training mode disable signal in case all of the plurality of comparison information signals are disabled when all of the logic levels of the plurality of comparison information signals are determined.

27. The method of claim 26, wherein the deciding of the logic levels of the self-training mode disable signal and the frequency division control signal further comprises initializing the frequency division control signal and the self-training mode disable signal to a disable state in response to a reset signal.

28. The method of claim 27, wherein the changing of the logic level of the frequency division control signal comprises:

disabling the self-training mode enable signal when the self-training mode disable signal is enabled after entering the self-training mode; and enabling the self-training mode enable signal when the self-training mode disable signal is disabled after entering the self-training mode.

29. The method of claim 28, wherein the sensing of the normal training mode entry or the self-training mode entry comprises:

sensing the entering of the self-training mode in response to the transit of a clock training mode enable signal from a disable state to an enable state;

sensing the entering of the normal training mode after escaping from the self-training mode in response to the transit of the self-training mode disable signal from a disable state to an enable state in a period where the clock training mode enable signal is enabled; and sensing escaping from the normal training mode in response to the transit of the clock training mode enable signal from the enable state to the disable state.

30. The method of claim 29, wherein the changing of the logic level of the frequency division control signal further comprises toggling the reset signal in response to the transit of the clock training mode enable signal from the disable state to the enable state.

* * * * *